United States Patent
Kim et al.

(10) Patent No.: US 11,089,691 B2
(45) Date of Patent: *Aug. 10, 2021

(54) MICROCIRCUIT FORMING METHOD AND ETCHING FLUID COMPOSITION

(71) Applicant: InkTec Co., Ltd., Ansan-si (KR)

(72) Inventors: Su Han Kim, Ansan-si (KR);
Kwang-Choon Chung, Yongin-si (KR);
Jung Yoon Moon, Ansan-si (KR); Sung In Ha, Hwaseong-si (KR); Byung Woong Moon, Siheung-si (KR)

(73) Assignee: InkTec Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/489,361

(22) PCT Filed: Feb. 27, 2018

(86) PCT No.: PCT/KR2018/002378
§ 371 (c)(1),
(2) Date: Dec. 24, 2019

(87) PCT Pub. No.: WO2018/159978
PCT Pub. Date: Sep. 7, 2018

(65) Prior Publication Data
US 2020/0163219 A1    May 21, 2020

(30) Foreign Application Priority Data
Mar. 3, 2017  (KR) .................. 10-2017-0027947

(51) Int. Cl.
*H05K 3/06*  (2006.01)
*C09K 13/00*  (2006.01)
(Continued)

(52) U.S. Cl.
CPC .............. *H05K 3/067* (2013.01); *C09K 13/00* (2013.01); *H05K 3/06* (2013.01); *H05K 3/108* (2013.01);
(Continued)

(58) Field of Classification Search
None
See application file for complete search history.

(56) References Cited

U.S. PATENT DOCUMENTS

| | | | | |
|---|---|---|---|---|
| 6,117,784 A | * | 9/2000 | Uzoh | H01L 21/288 438/694 |
| 9,773,928 B2 | * | 9/2017 | Fu | H01L 31/068 |
| 2020/0389979 A1 | * | 12/2020 | Chung | C09K 13/06 |

FOREIGN PATENT DOCUMENTS

| | | | | |
|---|---|---|---|---|
| KR | 10-0720526 | | 5/2007 | |
| KR | 100720526 | * | 5/2007 | ....... H01L 21/76814 |

(Continued)

OTHER PUBLICATIONS

International Search Report and the Written Opinion dated Jun. 29, 2018 From the International Searching Authority Re. Application No. PCT/KR2018/002378 and Its Translation of Search Report Into English. (10 Pages).

*Primary Examiner* — Jiong-Ping Lu (57) ABSTRACT

The disclosure relates to a microcircuit forming method. The microcircuit forming method according to the disclosure comprises: a seed-layer forming step for forming a high-reflectivity seed layer on a substrate material by using a conductive material; a pattern-layer forming step for forming a pattern layer on the seed layer, the pattern layer having a pattern hole arranged thereon to allow the seed layer to be selectively exposed therethrough; a plating step for filling the pattern hole with a conductive material; a pattern-layer removing step for removing the pattern layer; and a seed-layer patterning step for removing a part of the seed layer
(Continued)

which does not overlap the conductive material in the plating step, wherein the high-reflectivity seed layer has a specular reflection property.

10 Claims, 11 Drawing Sheets

(51) Int. Cl.
    *H05K 3/24*     (2006.01)
    *H05K 3/12*     (2006.01)
    *H05K 3/18*     (2006.01)
    *H05K 3/38*     (2006.01)
    *H05K 3/10*     (2006.01)

(52) U.S. Cl.
    CPC ........... *H05K 3/1275* (2013.01); *H05K 3/182* (2013.01); *H05K 3/243* (2013.01); *H05K 3/387* (2013.01); *H05K 3/245* (2013.01); *H05K 2201/2054* (2013.01); *H05K 2203/0723* (2013.01); *H05K 2203/0789* (2013.01); *H05K 2203/0793* (2013.01); *H05K 2203/0796* (2013.01)

(56) References Cited

FOREIGN PATENT DOCUMENTS

| KR | 20090081566 | * | 7/2009 | ................ C23F 1/02 |
| KR | 10-1044790 | | 6/2011 | |
| KR | 101044790 | * | 6/2011 | ............ H05K 3/188 |
| KR | 10-2013-0130515 | | 12/2013 | |
| KR | 10-1351213 | | 1/2014 | |
| KR | 10-1464860 | | 11/2014 | |
| WO | WO 2018/159978 | | 9/2018 | |

\* cited by examiner

| | EMBODIMENT | COMPARATIVE EXAMPLE |
|---|---|---|
| METAL FOR SEED LAYER | SILVER (Ag) | COPPER (Cu) |
| THICKNESS OF SEED LAYER | 0.35 ~ 0.45 μm | 2 ~ 3 μm |
| TEN-POINT MEAN ROUGHNESS (Rz) | 0.10 ~ 0.15 μm | 0.9 ~ 1.3 μm |
| REFLECTIVITY | WAVELENGTH 365nm | 77.5% | 33.8% |
| | WAVELENGTH 405nm | 93.5% | 39.1% |
| PATTERNING | 5/5 μm ACHIEVEMENT | 5/5 μm FAILURE |

| | ICP (ppm) | | | |
|---|---|---|---|---|
| | Ag | | Cu | |
| SELECTIVE ETCHING SOLUTION COMPOSITION 1 | 177.4 | | N.D | |
| SELECTIVE ETCHING SOLUTION COMPOSITION 2 | 173.5 | | N.D | |
| SELECTIVE ETCHING SOLUTION COMPOSITION 3 | 176.1 | | N.D | |
| COMPARATIVE EXAMPLE 1 | 147.2 | | 524.0 | |
| COMPARATIVE EXAMPLE 2 | 139.5 | | 255.4 | |
| COMPARATIVE EXAMPLE 3 | 171.3 | | 2,437 | |

Fig. 13

MICROCIRCUIT FORMING METHOD AND ETCHING FLUID COMPOSITION

RELATED APPLICATIONS

This application is a National Phase of PCT Patent Application No. PCT/KR2018/002378 having International filing date of Feb. 27, 2018, which claims the benefit of priority of Korean Patent Application No. 10-2017-0027947 filed on Mar. 3, 2017. The contents of the above applications are all incorporated by reference as if fully set forth herein in their entirety.

FIELD AND BACKGROUND OF THE INVENTION

The present invention relates to a method of forming a microcircuit, and more particularly to a method of forming a microcircuit, in which an electrically conductive seed layer is formed to have specular reflection characteristics and high reflectivity, so that a photosensitive resin can be improved in curing-straightness, thereby forming a microcircuit pattern at development.

As the information age comes, an electronics market has grown on a large scale and thus a market for ab electronic circuit is also growing rapidly. With development of technology, a high-performance and highly-integrated circuit has been increasingly required on the markets. As smart devices have come into wide use all over the world after a smartphone revolution, products have necessarily become lightweight, thin, short and compact. Therefore, there is a need of achieving a fine pitch of an electronic circuit such as a printed circuit board (PCB) to manufacture the products in response to such market demands.

As a conventional method of forming a circuit, a photolithography process, in which exposure is performed based on a photosensitive resin, and development, etching, and stripping are then performed to form a pattern, has mostly been used. The photolithography process refers to a method of manufacturing a copper circuit board as a desired pattern with the photosensitive resin is formed on a base material having a copper plating layer and subjected to exposure and etching. However, the minimum pitch achievable by such a general photolithography process is 25 µm, and it is therefore difficult to form a fine pattern.

Due to such difficulty on the process, a semi additive process (SAP) method or a modified semi additive process (MSAP) has recently been used as a technique for achieving the fline pitch. A typical SAP method makes a pattern based on lithography using a photosensitive resin be formed on a substrate material to which the seed layer of chrome, nickel, copper or the like metal is thinly stacked by sputtering, chemical vapor deposition (CVD), electroless plating, copper clad pressing, etc. A pattern groove formed as above is plated with a conductive material such as copper, etc., and then the photosensitive resin is removed. The metal seed layer, from which the photosensitive resin is removed after the circuit is formed based on copper plating, is removed by an etching solution, thereby forming a circuit having a fine pitch. Therefore, interaction among the substrate material, the photosensitive resin, and the exposure system is important to achieve the fine pitch.

However, a typical substrate material for a metal seed layer, to which the SAP method is applicable, has so low reflectivity that high energy is required to cure the photosensitive resin at the exposure. Further, the typical substrate material for the metal seed layer has so high surface roughness that diffuse reflection occurs during the exposure. The diffuse reflection caused by high energy damages the photosensitive resin layer and thus forms a nonuniform circuit at development. Further, an underlayer of the photosensitive resin remains on the seed layer, thereby causing a foot phenomenon. In particular, the substrate material for the seed layer of copper (Cu) has a reflectivity less than 40% at a wavelength of 365 nm~405 nm, and has a ten-point mean roughness Rz higher than or equal to 1 µm, and it is difficult for this material to form a uniform circuit when the circuit is designed to have a pitch smaller than or equal to 14 µm.

To control this phenomenon, when low energy is used, the underlayer of the photosensitive resin is not completely cured, thereby causing an undercut phenomenon that even a portion designed not to be developed is developed during the development.

Therefore, it is difficult to achieve the circuit having an ultrafine pitch smaller than or equal to 14 µm with the typical substrate material for the metal seed layer.

Figure 11:
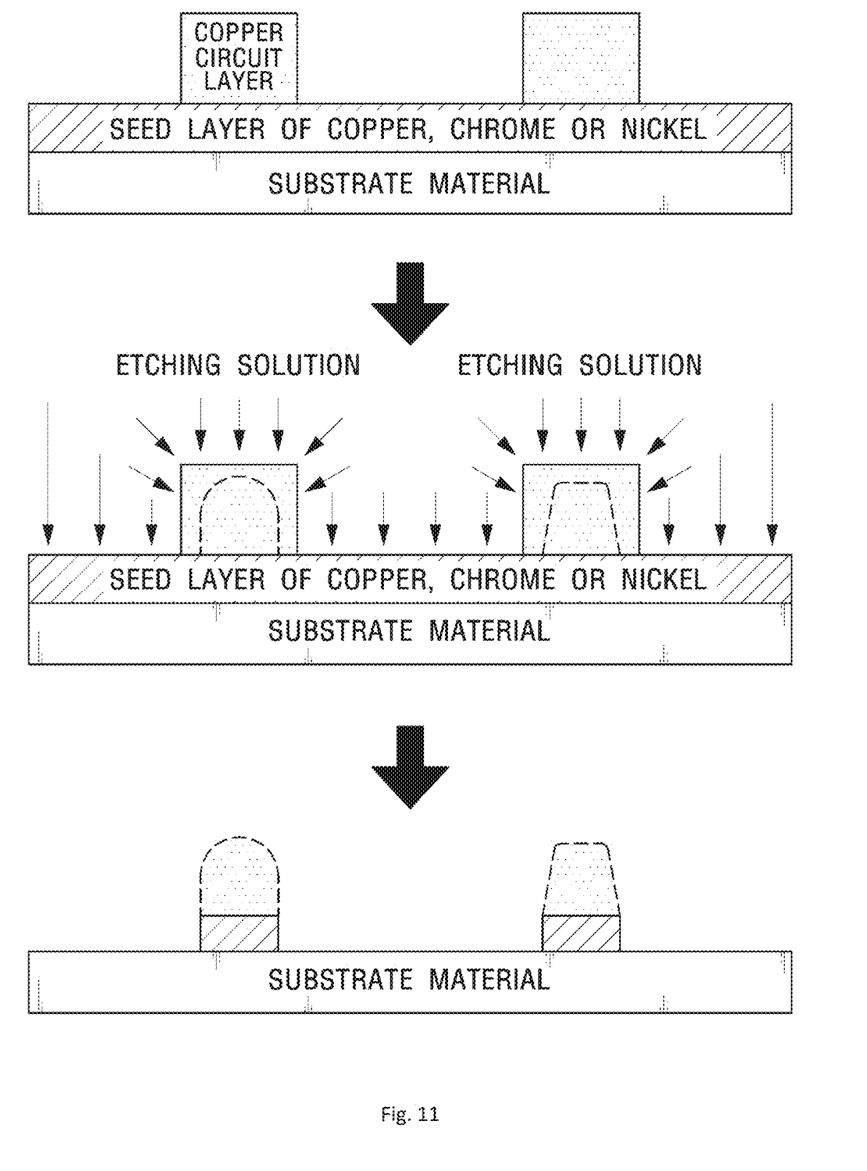
FIG. 11 is a schematic view showing a conventional method of forming a circuit by using a substrate material and an etching solution composition.

Further, a circuit forming portion made of copper is also etched together with the seed layer as shown in FIG. 11 while the seed layer is etched by the etching solution, thereby causing a nonuniform thickness and a nonuniform linewidth. Besides, when the seed layer is not completely removed, it leads to a defective product because of migration.

In addition, an etching solution, which has been hitherto used for etching a metal wiring or thin film, generally includes phosphoric acid, nitric acid, acetic acid, hydrochloric acid, sulfuric acid, ammonia, iron phosphate, iron nitrate, iron sulfate, iron hydrochloride, sodium chlorate, and water. However, when the seed layer is removed by the etching solution, the etching solution damages even a circuit portion of coper, thereby causing a problem that a pattern is formed with a low etch factor.

SUMMARY OF THE INVENTION

It was found that the most important thing to get a more precise microcircuit pattern of an electronic circuit through exposure, development, etching and stripping equipment typically used in producing a printed circuit board (PCB) and the like electronic circuit pattern was characteristics of an electrically conductive seed layer formed on a base material. It was checked that the surface roughness and reflectivity of the electrically conductive seed layer, and the thickness of the seed layer affecting optical reflectivity were the most important characteristics to form a microcircuit pattern based on a photolithography process.

An aspect of the present invention is to provide a method of forming a microcircuit, in which a metal seed layer having characteristics of low surface roughness, specular reflection, and reflectivity higher than or equal to 50% and excellent in electric conductivity is formed on a base material, so that a photosensitive resin layer can have the minimum diffuse reflection and high specular reflectivity at exposure, and thus a photocuring precision of a pattern can be enhanced in a photolithography process, thereby forming a microcircuit pattern during development.

Further, an aspect of the present invention is to provide an etching solution composition, with which only silver, a silver alloy or a silver compound is selectively etched minimizing removal of a copper circuit layer, thereby having a high etch factor and preventing a copper circuit layer from damage.

The foregoing aspects of the present invention are achieved by providing a method of forming a microcircuit, including: a seed-layer forming step of forming a conductive high-reflectivity seed layer on a substrate material; a pattern-layer forming step of forming a pattern layer with a pattern groove, through which the seed layer is selectively exposed, on the seed layer; a plating step of filling the pattern groove with a conductive material; a pattern-layer removing step of removing the pattern layer; and a seed-layer patterning step of removing the seed layer, which does not overlap with the conductive material of the plating step, the high-reflectivity seed layer including a specular reflection characteristic.

Here, the high-reflectivity seed layer may include metal having high reflectivity.

Further, the high-reflectivity seed layer may include a reflectivity higher than or equal to 50%.

Further, the reflectivity is shown at a wavelength range of 365 nm to 405 nm.

Further, the seed layer may include a ten-point mean roughness Rz lower than 1 μm.

Further, the seed-layer forming step may include applying a primer, which lowers surface roughness of the substrate material, onto the substrate material, and then forming the high-reflectivity seed layer on the primer.

Further, the seed layer and the conductive material are different in material from each other, and the seed-layer patterning step may include patterning the seed layer by a selective etching solution capable of dissolving only the seed layer.

Further, the seed layer may include silver (Ag), and the conductive material may include copper (Cu).

Further, the selective etching solution may include an oxidizing agent; amines or an ammonium compound; an additive; and water.

Further, the selective etching solution may include 1 to 30 wt % of oxidizing agent, 1 to 75 wt % of amine or ammonium compound, 0.1 to 10 wt % of additive, and a remaining wt % of water with respect to a total 100 wt % of the selective etching solution.

Further, the oxidizing agent may include one or more selected from a group consisting of oxidative gas, peroxides, peroxy acid, and potassium persulfate.

Further, the oxidative gas may include one or more selected from a group consisting of air, oxygen, and ozone; the peroxide may include one or more selected from a group consisting of sodium perborate, hydrogen peroxide, sodium bismuthate, sodium percarbonate, benzoyl peroxide, potassium peroxide, and sodium peroxide; and the peroxy acid may include one or more selected from a group consisting of formic acid, peroxyacetic acid, perbenzoic acid, 3-chloroperoxybenzoic acid, and trimethylacetic acid.

Further, the amines may include one or more selected from a group consisting of an aliphatic amine, an aromatic amine, and an alkanol amine.

Further, the amines or ammonium compound may include one or more selected from a group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol, ammonium carbonate, ammonium phosphate, ammonium nitrate, ammonium fluoride, and ammonium hydroxide.

Further, the additive may include one or more selected from a group consisting of a chelate agent, an antifoaming agent, a wetting agent, and a pH regulator.

The foregoing aspects of the present invention are achieved by providing a selective etching solution composition used in the method of forming a microcircuit, the etching solution composition including an oxidizing agent; amines or an ammonium compound; an additive; and water.

Here, the selective etching solution composition may include 1 to 30 wt % of oxidizing agent, 1 to 75 wt % of amine or ammonium compound, 0.1 to 10 wt % of additive, and a remaining wt % of water with respect to a total 100 wt % of the selective etching solution composition.

Further, the oxidizing agent may include one or more selected from a group consisting of oxidative gas, peroxides, peroxy acid, and potassium persulfate.

Further, the oxidative gas may include one or more selected from a group consisting of air, oxygen, and ozone; the peroxide may include one or more selected from a group consisting of sodium perborate, hydrogen peroxide, sodium bismuthate, sodium percarbonate, benzoyl peroxide, potassium peroxide, and sodium peroxide; and the peroxy acid may include one or more selected from a group consisting of formic acid, peroxyacetic acid, perbenzoic acid, 3-chloroperoxybenzoic acid, and trimethylacetic acid.

Further, the amines may include one or more selected from a group consisting of an aliphatic amine, an aromatic amine, and an alkanol amine.

Further, the amines or ammonium compound may include one or more selected from a group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol, ammonium carbonate, ammonium phosphate, ammonium nitrate, ammonium fluoride, and ammonium hydroxide.

Further, the additive may include one or more selected from a group consisting of a chelate agent, an antifoaming agent, a wetting agent, and a pH regulator.

According to the present invention, there is provided a method of forming a microcircuit, by which a ultrafine circuit pattern smaller than 7/7 μm can be actualized.

Specifically, there is provided a method of forming a microcircuit, which is applicable to various products required to be lightweight, thin, short and compact because the method makes it possible to design a high-performance and highly-integrated circuit, and applicable to various substrate materials through a typical process of forming the metal seed layer.

Further, according to the present invention, there is provided an etching solution composition having a high etch factor so that only a silver seed layer can be selectively etched without damaging a copper circuit. These make it possible to design a high-performance and highly-integrated circuit, and the circuit is variously applicable to a product required to be lightweight, thin, short and compact.

DESCRIPTION OF SPECIFIC EMBODIMENTS OF THE INVENTION

Below, a method of forming the microcircuit according to the present invention will be described in detail with reference to the accompanying drawings.

Figure 1:
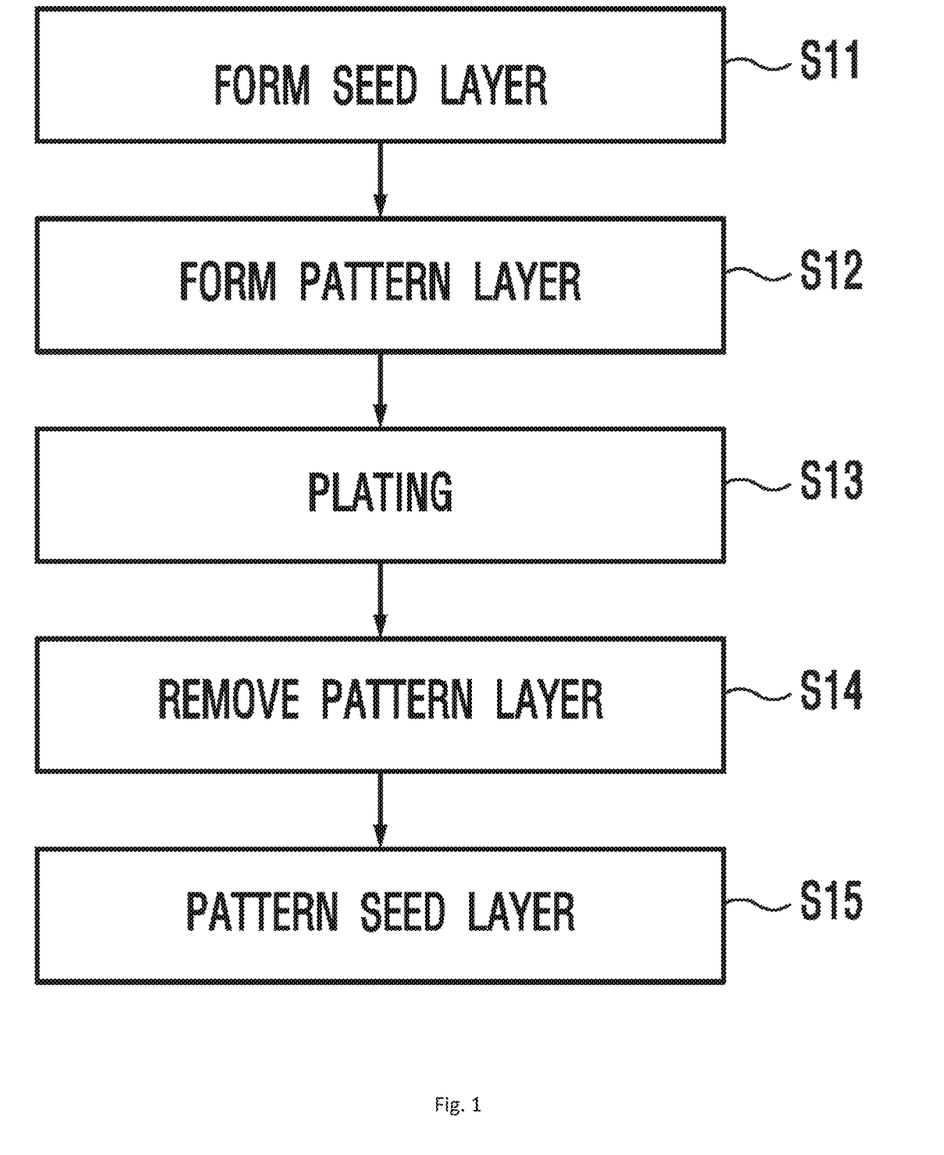
FIG. 1 is a flowchart showing a method of forming a microcircuit according to the present invention.
Figure 2:
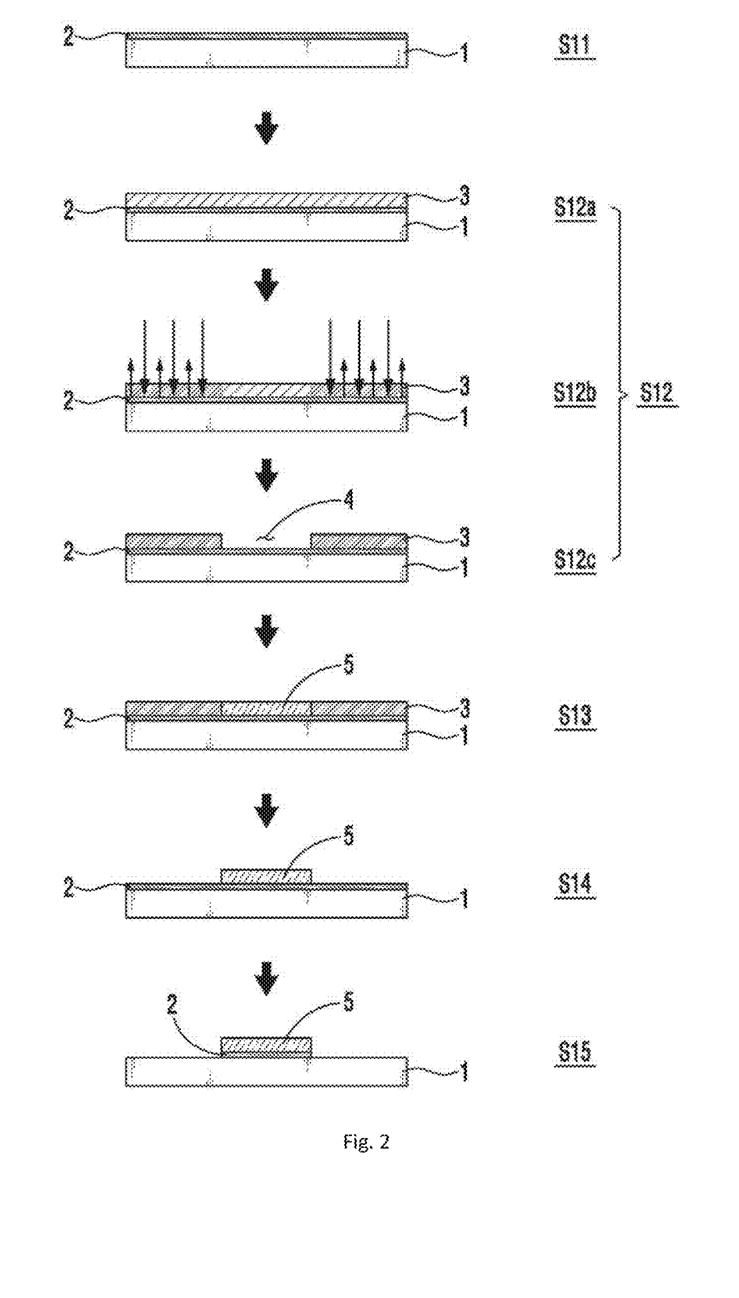
FIG. 2 is a schematic view showing a method of forming a microcircuit according to the present invention.

FIG. 1 is a flowchart showing a method of forming a microcircuit according to the present invention, and FIG. 2 is a schematic view showing a method of forming a microcircuit according to the present invention.

As shown in FIGS. 1 and 2, the method of forming the microcircuit according to the present invention includes a seed-layer forming step S11 of preparing a conductive high-reflectivity seed layer 2; a pattern-layer forming step S12 of forming a pattern layer 3 with a pattern groove 4, through which the seed layer 2 is exposed, on the seed layer 2; a plating step S13 of filling a conductive material 5 in the pattern groove 4 to form a circuit; a pattern-layer removing step S14 of removing the pattern layer 3; and a seed-layer patterning step S15 of patterning the seed layer 2 by the conductive material 5 of the plating step.

In the seed-layer forming step S11, the seed layer 2 to be formed on a substrate material 1 is provided as an electrically conductive seed layer 2 having characteristics of specular reflection and high reflectivity. The seed layer 2 may be formed by sputtering, chemical vapor deposition (CVD), electroless plating, electroplating, coating, dipping, flexographic printing, gravure printing, gravure offset, or the like process. Besides these processes, a universal process for forming a thin metal film having high reflectivity may be used.

The seed layer 2 may contain metal, a metal alloy, or a metal compound. The seed layer 2 may be largely varied in reflectivity depending on the kinds of metal, and thus may employ metal, for example, silver (Ag), having higher optical reflectivity than copper (Cu) that has been conventionally used.

Specifically, the seed layer 2 may include silver (Ag), a silver alloy, or a silver compound. Meanwhile, the metal compound may have a composition including metal particles, metal oxide, a resin for combining the particles, a dispersing agent, etc. to facilitate a coating or printing method of forming the seed layer 2.

In the seed-layer forming step S11, the seed layer 2 is formed to have a reflectivity higher than or equal to 50%, and preferably 70% at a wavelength range of 365-405 nm, and have a specular reflection characteristic. Based on such characteristics of reflectivity and specular reflection, it is possible to form an ultrafine circuit pattern that has not been conventionally provided.

Specifically, to provide such characteristics of the specular reflection and the reflectivity, the seed layer 2 is made of metal having high reflectivity, for example, silver (Ag) or a silver alloy. In this case, the seed layer 2 may have a ten-point mean roughness Rz lower than 1 μm, preferably 0.5 μm, and more preferably 0.15 μm, thereby lowering diffuse reflection and providing the highest reflectivity in the specular reflection characteristic.

When the seed layer 2 has a ten-point mean roughness Rz higher than or equal to 1 μm, diffuse reflection increases due to a rough surface. The increase in the diffuse reflection causes a photosensitive resin layer to be damaged at the exposure, and it is thus difficult to form a microcircuit pattern.

Further, the seed layer 2 may have a thickness greater than or equal to 50 nm. Preferably, the seed layer 2 may have a thickness greater than or equal to 150 nm so that the surface roughness of the seed layer 2 cannot be affected by the surface roughness of the substrate material 1. More preferably, the seed layer 2 may have a thickness of 80 nm~1 μm, but this example does not limit the scope of the present invention.

When the seed layer 2 has a thickness smaller than 50 nm, exposure light transmits the surface of the seed layer 2, and is then absorbed in the substrate material 1 or reflected from the surface of the substrate material 1, thereby decreasing the reflectivity and increasing the diffuse reflection. Thus, it may be difficult to form a fine circuit pattern.

With such metal's own high-reflectivity, surface roughness, and thickness formation, the seed layer 2 is formed to have a reflectivity higher than or equal to 50% or a specular reflection characteristic, thereby achieving a microcircuit pattern.

Figure 3:
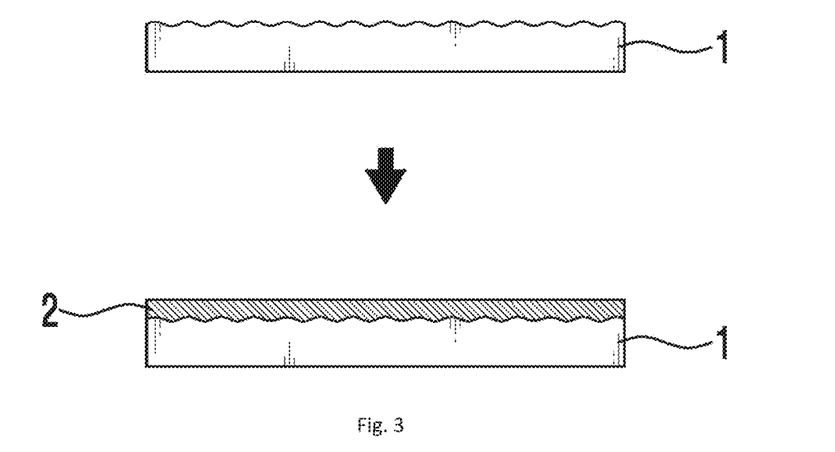
FIG. 3 is a schematic view showing an example of a seed-layer forming step in a method of forming a microcircuit according to the present invention.
Figure 4:
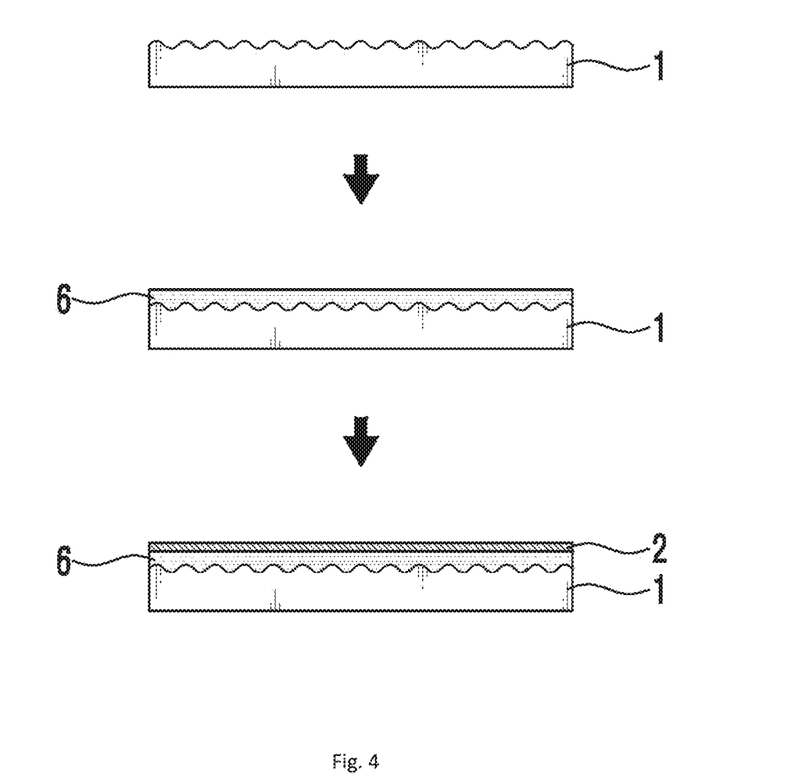
FIG. 4 is a schematic view showing another example of a seed-layer forming step in a method of forming a microcircuit according to the present invention.

As an example of forming the seed layer 2, referring to FIG. 3, the seed layer 2 is formed by coating metal having high reflectivity, e.g. silver (Ag) to have a thickness greater than or equal to 150 nm on the substrate material 1, thereby making the seed layer 2 have a ten-point mean roughness Rz lower than 500 nm. Referring to FIG. 4, a primer 6 is applied to the substrate material 1 having high surface roughness, and then the seed layer 2 is formed by coating metal having high reflectivity, e.g. silver (Ag) to have a thickness greater than or equal to 150 nm on the substrate material 1, thereby making the seed layer 2 have a ten-point mean roughness Rz lower than 500 nm. Here, the primer 6 may include a polymer resin, and preferably a thermosetting resin, a photocurable resin, etc. to not only enhance adhesion between the substrate material 1 and the metal seed layer 2 but also lower the surface roughness of the substrate material 1. Meanwhile, the methods shown in FIGS. 3 and 4 are described as the example of the method of forming the seed layer 2, but the present invention is not limited to these methods.

Specifically, the primer 6 may include a thermosetting resin, and be coated on the substrate material 1 as semi-cured or not cured. That is, the uncured primer 6 becomes in close contact with the substrate material 1 and cured by pressure and heat applied from a hot-press device, while filling in the uneven surface of the substrate material 1. Therefore, the surface roughness of the seed layer 2 is not affected by the surface roughness of the substrate material 1 even though the seed layer 2 is thin.

In the pattern-layer forming step S12, the pattern layer 3 is formed by applying the photosensitive resin onto the prepared seed layer 2 (S12a), partially exposed through the photolithography process (S12b), and then removed (S12c), thereby forming the pattern groove 4 through which the seed layer 2 is selectively exposed. Thus, in the pattern-layer forming step S12, a portion designed to form a circuit on the seed layer 2 is selectively exposed through the pattern groove 4, and a portion designed not to form the circuit is protected by the pattern layer 3.

Meanwhile, in the pattern-layer forming step S12 shown in FIG. 2, negative-type photoresist PR is used as the photosensitive resin. As necessary, positive-type photoresist may be used.

Further, in the exposure step S12b of the pattern-layer forming step S12, exposure light having a long wavelength may be used. This is because the reflectivity increases as the wavelength becomes longer.

Figure 5:
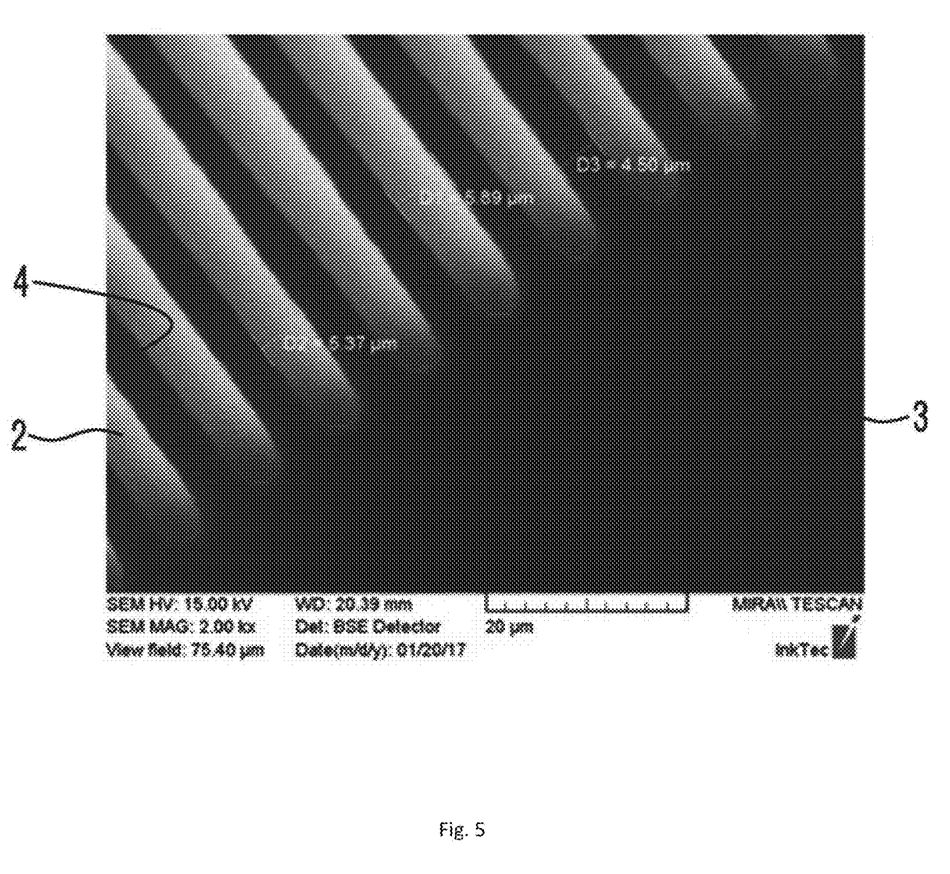
FIG. 5 is a scanning electron microscopy (SEM) picture showing a microcircuit formed by removing a photosensitive resin in a method of forming a microcircuit according to the present invention.

Here, the seed layer 2 having the characteristics of the specular reflection and the reflectivity higher than equal to 50% is improved in curing-straightness because of the minimum diffuse reflection on the surface of the seed layer 2 while the pattern groove 4 is formed by the photolithography process, thereby preventing a foot phenomenon or an undercut phenomenon during the development of the photosensitive resin. Therefore, the pattern groove 4 formed in the pattern-layer forming step S12 is uniform and fine as shown in FIG. 5.

Then, in the plating step S13, the conductive material 5 is plated to fill the conductive material 5 inside the pattern groove 4. In this case, the conductive material 5 may be made of copper (Cu) of which electric conductivity is very high. In the plating step S13, the seed layer 2 exposed through the pattern groove 4 serves as an electrode, so that the conductive material 5 can be filled in the pattern groove 4.

Figure 6:
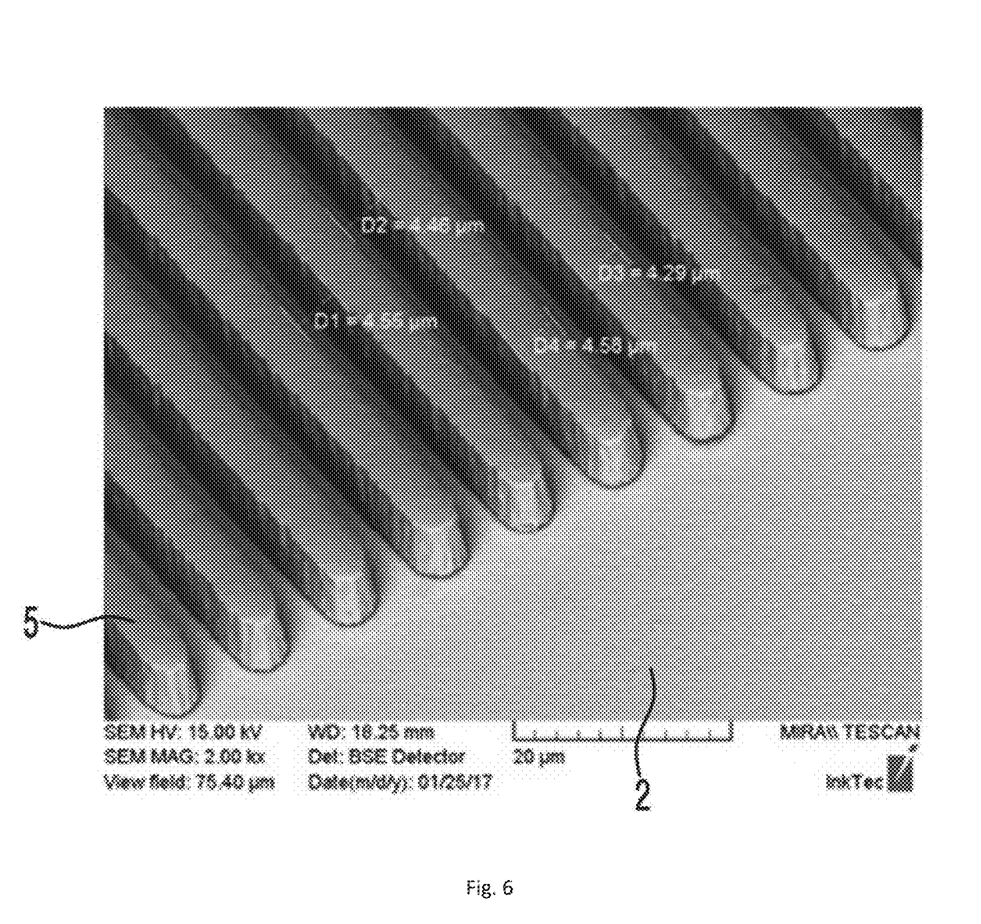
FIG. 6 is a SEM picture showing a microcircuit formed by removing a photosensitive resin after filling a conductive material in a method of forming a microcircuit according to the present invention.

Then, in the pattern-layer removing step S14, the pattern layer 3 is removed. When only the pattern layer 3 is removed except the conductive material 5 filled in the pattern groove 4, only the conductive material 5 remains as a pattern on the seed layer 2 as shown in FIG. 6.

Figure 7:
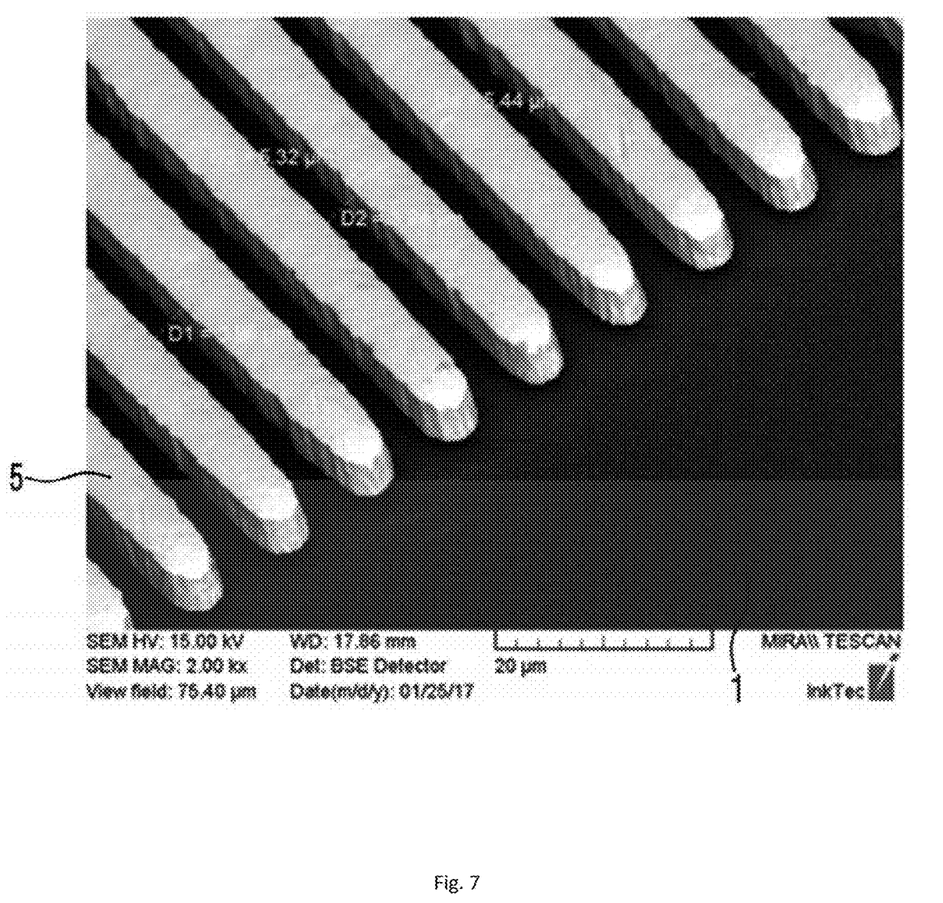
FIG. 7 is a SEM picture showing a microcircuit formed after removing only a seed layer in a method of forming a microcircuit according to the present invention.

In the seed layer removing step S15, the seed layer 2 that does not overlap with the conductive material 5 of the plating step S13 is removed, thereby forming a desired ultrafine circuit pattern as shown in FIG. 7. Here, the seed layer 2 is made of a material different from that of the conductive material 5 of the plating step, and therefore the seed layer 2 is patterned by an etching solution capable of dissolving only the seed layer 2 in the seed-layer patterning step S15.

In particular, in the seed layer removing step S15, the seed layer 2 exposed through the patterned conductive material is removed, thereby forming an ultrafine circuit pattern corresponding to a desired pattern. To remove the seed layer 2, an etching solution capable of selectively etching only the seed layer 2 made of silver, a silver alloy or a silver compound is employed. That is, only the seed layer 2 of silver is selectively etched without damaging the conductive material 5 of copper.

Figure 12:
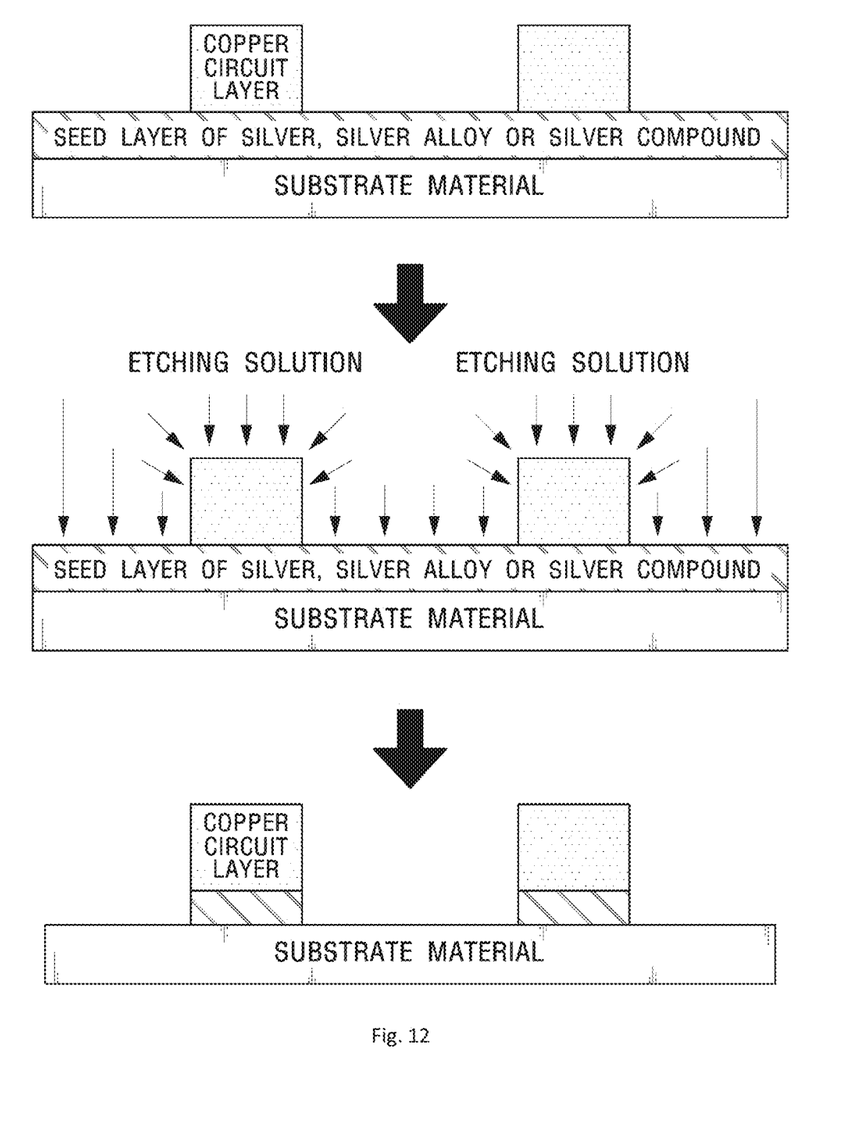
FIG. 12 is a schematic view showing a microcircuit forming process by selectively etching a seed layer according to the present invention.

In other words, the seed layer 2 according to an embodiment is made of silver, a silver alloy or a silver compound, and the etching solution for selectively etching only the seed layer 2 is used, so that a circuit board can be formed to have a fine pitch without damaging the conductive material of copper during the process of etching the seed layer of silver as shown in FIG. 12, unlike a conventional case in which the seed layer 2 and the conductive material 5 are all made of copper and thus there is a problem that the conductive material is damaged by the etching solution while removing the seed layer 2 as shown in FIG. 11.

Below, detailed descriptions will be made with reference to an embodiment according to the present invention and a comparative example.

Figure 8:
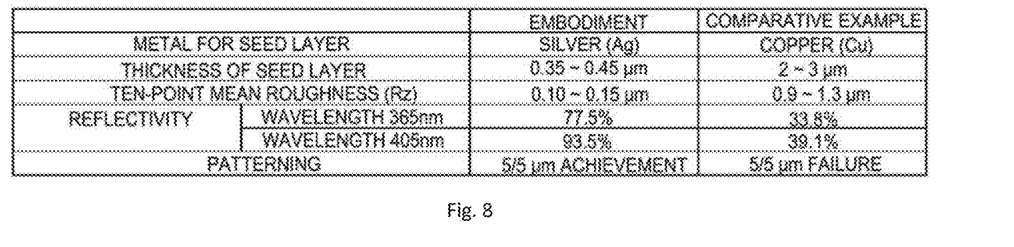
FIGS. 8 and 9 are a table for comparison in a ten-point mean roughness between an embodiment of the present invention and a comparative example.
Figure 9:
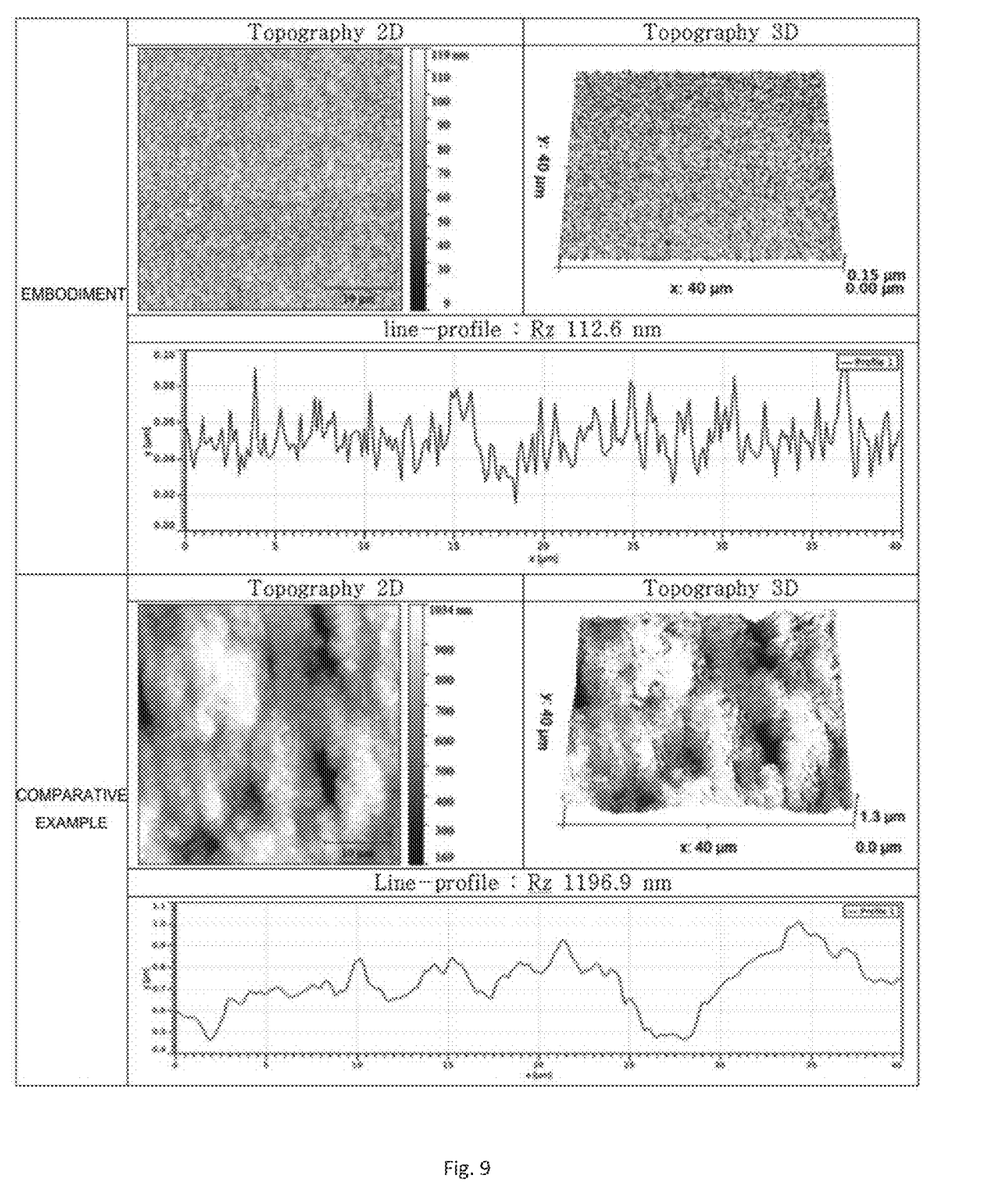
Figure 10:
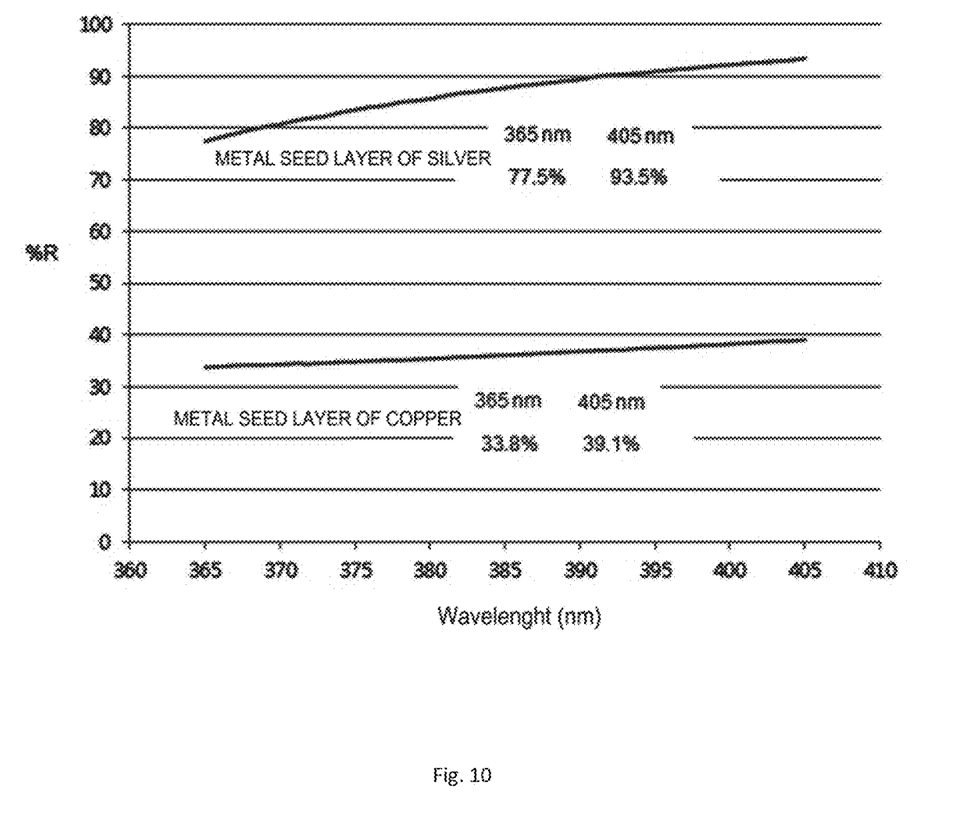
FIG. 10 is a reflectivity graph of an embodiment of the present invention and a comparative example.

As shown in FIGS. 8 and 9, the embodiment according to the present invention shows that metal having high reflectivity, i.e. silver (Ag) is used to form a silver seed layer 2 having characteristics of a thickness of 0.35~0.45 µm, a ten-point mean roughness Rz of 110 nm and specular reflection, and a comparative example shows that copper (Cu) is used to form a copper seed layer having a thickness of 2~3 µm, and a ten-point mean roughness Rz of 0.9~1.3 µm. Referring to FIG. 10, the embodiment of the present invention shows a reflectivity of 77.5% at a wavelength of 365 nm, and a reflectivity of 93.5% at a wavelength of 405 nm, but the comparative example shows a reflectivity of 33.8% at a wavelength of 365 nm and a reflectivity of 39.1% at a wavelength of 405 nm.

In other words, the silver seed layer 2 of the embodiment has higher reflectivity than the copper seed layer of the comparative example, and ultimately the specular reflection characteristic of the silver seed layer makes it possible to actualize a microcircuit pattern of 5/5 µm that the comparative example can hardly actualize.

Like this, according to the present invention, instead of the typical seed layer having low reflectivity, the seed layer 2 includes metal having high reflectivity, a metal alloy, or a metal compound to lower surface roughness and minimize diffuse reflection, and is formed to have a thickness greater than or equal to 50 nm, a specular reflection, and a reflectivity higher than or equal to 50% by sputtering, CVD, electroless plating, electroplating, coating, dipping, flexographic printing, gravure printing, gravure offset, or the like process, thereby forming an ultrafine circuit through the SAP method.

Further, as described above, the present invention relates to an etching solution composition for selectively etching only silver, a silver alloy or a silver compound.

The seed layer refers to a thin film including silver, a silver alloy or a silver compound, and the seed-layer forming process may include sputtering, CVD, electroless plating, coating, and dipping processes, and any universal process capable of forming metal, a metal alloy, or a metal compound. However, there are no specific limits to the seed-layer forming process.

Below, a selective etching solution composition for silver, a silver alloy or a silver compound of the present invention will be described.

As the selective etching solution composition according to the present invention, there may be used an etching solution composition that contains an ammonium compound and an oxidizing agent, disclosed in Korean Patent No. 10-0712879 owned by the present applicant; or a selective etching solution composition that contains oxidative gas, peroxides, peroxy acid, or the like oxidizing agent, aliphatic amine or aromatic amine or alkanol amine or an ammonium compound, a chelate agent, defoamer, humectant, pH regulator and one or more other additives selected for improving etching performance of the etching solution, and water. Each composition of the selective etching solutions will be described below in detail.

The oxidizing agent contained in the etching solution composition for silver, a silver alloy or a silver compound serves to oxidize silver on the surface of the seed layer. The related art has disclosed the etching solution composition or the like using nitric acid, hydrochloric acid, sulfuric acid, phosphoric acid, iron nitrate, iron chloride, iron sulfate, iron phosphate, etc. However, such conventional etching solution compositions refer to materials for oxidizing and dissociating copper, nickel, chrome or the like metal, and are not suitable to be used as a circuit etching solution for selectively etching only silver.

The oxidizing agent includes air, oxygen, ozone or the like oxidative gas, sodium perborate, hydrogen peroxide, sodium bismuthate, sodium percarbonate, benzoyl peroxide, potassium peroxide, sodium peroxide or the like peroxides, formic acid, peroxyacetic acid, perbenzoic acid, 3-chloroperoxybenzoic acid, trimethylacetic acid or the like peroxy acid, and potassium persulfate. The oxidizing agent may be used mixing with at least one oxidizing agent.

With respect to the total weight of the etching solution composition of silver, a silver alloy or a silver compound, 1 to 30 wt %, more preferably, 5 to 18 wt % of oxidizing agent may be included. The oxidizing agent lower than 1 wt % makes etching speed be low and etching be incompletely performed, thereby producing a lot of silver residue. The silver residue may be present between a circuit and a circuit and cause a short-circuit, thereby causing a defective product. Further, productivity is adversely affected by the low etching speed. On the other hand, the oxidizing agent more than 30 wt % makes the exposed seed layer 2 be fast etched, but affects the seed layer 2 present under the circuit layer, thereby causing an excessive under-cut. Such an under-cut phenomenon has an adverse effect on the adhesion of the circuit layer, and thus needs to be suppressed.

Aliphatic amine or aromatic amine or alkanol amine or ammonium compound contained in the etching solution composition for silver, a silver alloy or a silver compound of the present invention serves to dissociate silver oxidized in the seed layer. By oxidation based on the oxidizing agent and dissociation based on aliphatic or aromatic amine, it is possible to selectively etch only silver, a silver alloy or a silver compound. As described above, nitric acid, hydrochloric acid, sulfuric acid, phosphoric acid, iron nitrate, iron hydrochloride, iron sulfate, iron phosphate, etc. included in the conventional etching solution composition cause both oxidation and dissociation because one material serves as a main etching agent to react with copper. However, in the etching solution according to the present invention, two materials are respectively in charge of the oxidation and the dissociation, and the aliphatic or aromatic amine or alkanol amine or the ammonium compound has a more violent dissociation reaction with oxidized silver than with copper, thereby selectively etching only the seed layer made of silver, a silver alloy or a silver compound.

The aliphatic or aromatic amine or alkanol amine or the ammonium compound may use ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethanolamine, 1-aminoethanol, 2-amino-2-methyl-1-propanol, ammonium carbonate, ammonium phosphate, ammonium nitrate, ammonium fluoride, ammonium hydroxide, or the like amines or ammonium compound. When such amines or ammonium compound is used, at least one of the amines or the ammonium compound may be mixed.

With respect to the total weight of the etching solution composition of the seed layer 2 made of silver, 1 to 75 wt %, more preferably, 20 to 70 wt % of aliphatic or aromatic amine or alkanol amine or the ammonium compound may be included. The aliphatic or aromatic amine or alkanol amine or the ammonium compound lower than 1 wt % makes a dissociation reaction with oxidized silver be inactive, thereby lowering the speed of etching the silver seed layer. On the other hand, the aliphatic or aromatic amine or alkanol amine or the ammonium compound more than 75 wt % has no problem in selectively etching the seed layer, but excessive use of the amines or the ammonium compound hinders the oxidizing agent in the etching solution from oxidizing silver, a sliver alloy or a silver compound and thus lowers the selective-etching speed. Therefore, the amines or the ammonium compound is used enough to cause a surface oxidation reaction of the seed layer and dissolve oxidized silver to make selective etching smooth.

The chelate agent, defoamer, humectant, pH regulator and one or more other additives selected for improving etching performance of the etching solution, which are included in the etching solution composition for silver, a silver alloy or a silver compound according to the present invention, serve to remove bubbles that may be generated in the oxidation reaction, give wetting properties so that the etching solution can be well absorbed onto the surface of the seed layer, and so on. Besides, general purpose additives may be selected and used to increase the effects of the present invention.

With respect to the total weight of the etching solution composition for the silver seed layer, each of the additives may be included by 0.1 to 10 wt %, more preferably, 1-7 wt % according to the kinds and purposes thereof. The additives less than 0.1 wt % cannot carry out their own roles of improving the effects of the present invention, i.e. the selective etching characteristic. The additives more than 10 wt % gelatinize the etching solution, thereby largely degrading the etching characteristics.

A remainder of a total 100 wt % etching solution composition for silver, a silver alloy or a silver compound according to the present invention except the foregoing materials is water. Deionized water may be used for this water.

Hereinafter, embodiments of the present invention will be described in more detail. However, the embodiments are merely examples of the present invention, and do not limit the scope of the present invention.

Embodiment 1: Preparation of Selective Etching Solution Composition 1-1: Preparation of Selective Etching Solution Composition 1

Hydrogen peroxide 12 wt %, monoethanolamine 40 wt %, wetting agent 1 wt %, antifoaming agent 1 wt %, and deionized (DI) water 46 wt % were mixed to prepare a selective etching solution composition 1.

1-2: Preparation of Selective Etching Solution Composition 2

Sodium percarbonate 7 wt %, N-methyldiethnaolamine 32.5 wt %, wetting agent 0.5 wt %, antifoaming agent 1 wt %, and DI water 59 wt % were mixed to prepare a selective etching solution composition 2.

1-3: Preparation of Selective Etching Solution Composition 3

Sodium percarbonate 4 wt %, N-methyldiethnaolamine 60 wt %, wetting agent 1.5 wt %, antifoaming agent 0.5 wt %, and DI water 34 wt % were mixed to prepare a selective etching solution composition 3.

Embodiment 2: Preparation of Comparative Examples 2-1: Preparation of Comparative Example 1

For comparison with the selective etching solution compositions 1 to 3 prepared in the embodiment 1, with reference to the embodiment 1 disclosed in Korean Patent Publication No. 10-2016-0115189, iron (III) 10 wt %, nitric acid 5 wt %, acetic acid 5 wt %, EDTA 1 wt %, glycolic acid 1 wt %, and DI water 78 wt % were mixed to prepare a comparative example 1.

2-2: Preparation of Comparative Example 2

For comparison with the selective etching solution compositions 1 to 3 prepared in the embodiment 1, with reference to the embodiment 1 disclosed in Korean Patent Publication No. 10-2010-0098409호, ammonia 7 wt %, hydrogen peroxide 1.5 wt %, and DI water 91.5 wt % were mixed to prepare a comparative example 2.

2-3: Preparation of Comparative Example 3

For comparison with the selective etching solution compositions 1 to 3 prepared in the embodiment 1, with reference to the comparative embodiment 2 disclosed in Korean Patent Publication No. 10-2010-0098409, phosphoric acid 50 wt %, nitric acid 5 wt %, acetic acid 30 wt %, and DI water 15 wt % were mixed to prepare a comparative example 3.

Embodiment 3: Etching Test Results

Figure 13:
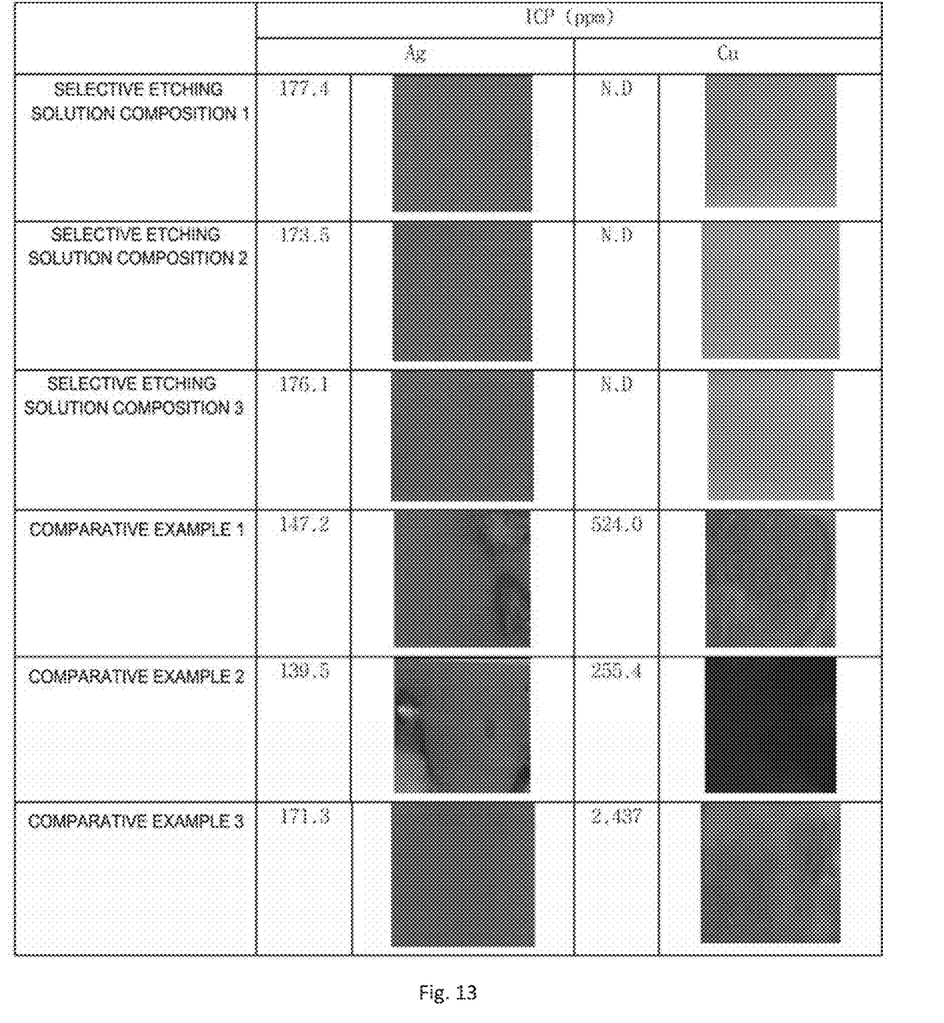
FIG. 13 is an etching test table of an etching solution composition according to the present invention and a comparative example.

Under test conditions such as a substrate material of polyimide (PI), a specimen size of 2.5×2.5 cm (Ag coating seed layer, Cu-flexible copper clad laminate (FCCL)), an etching solution of 40 g, an etching time of 10 seconds, and an inductively coupled plasma (ICP) analysis of regarding less than 5 ppm as not detected (N.D), the selective etching solution composition prepared in the embodiment 1 and the comparative example prepared in the embodiment 2 were subjected to an etching test (see FIG. 13).

As a result, with the selective etching solution compositions 1 to 3 and for the etching time of 10 seconds, silver was etched to expose the surface of the PI substrate material. However, the surface of the CuFCCL did not have any specific discoloration or anything significant, and therefore it was appreciated that the etching solution made no surface oxidation.

On the other hand, with the comparative examples 1 and 2 and for the same period of time, silver was not etched by 100% leaving a residue, and the surface of the CuFCCL was oxidized and discolored. Further, with the comparative example 3 and for the same period of time, silver was etched by 100%, but the surface of the CuFCCL was quickly etched and rapidly oxidized.

Silver and copper detected in the etching solution by the ICP analysis are as follows. In the comparative examples 1 and 2 with which silver was not etched by 100%, silver less than 170 ppm was detected. In the comparative examples 1 to 3 with which the surface of the CuFCCL was oxidized and discolored, copper was detected. In particular, the comparative example 1 and 3 with which silver was much etched, copper was also quickly etched and thus much detected.

In conclusion, unlike the comparative examples 1 to 3, the selective etching solution compositions 1 to 3 made silver be etched 100%, i.e. more than 170 ppm for the etching time of 10 seconds, and copper be not detected, i.e. N.D (detected as much as less than 5 ppm). Therefore, it was understood that the selective etching solution compositions 1 to 3 selectively etched only silver.

The present invention is not limited to the foregoing embodiments, and may be actualized by various embodiments within the appended claims. It will be appreciated by any person having an ordinary skill in the art that changes can be made in these embodiments without departing from the scope of the present invention defined in the appended claims.

REFERENCE NUMERALS

1: substrate material
2: seed layer
3: pattern layer
4: pattern groove
5: conductive material
6: primer

What is claimed is:

1. A method of forming a microcircuit, comprising:
a seed-layer forming step of forming a conductive seed layer having a reflectivity higher than or equal to 50% on a substrate material;
a pattern-layer forming step of forming a pattern layer with a pattern groove, through which the seed layer is selectively exposed, on the seed layer;
a plating step of filling the pattern groove with a conductive material;
a pattern-layer removing step of removing the pattern layer; and
a seed-layer patterning step of removing the seed layer, which does not overlap with the conductive material of the plating step,
wherein the seed layer comprises a specular reflection characteristic,
wherein the reflectivity is shown at a wavelength range of 365 nm to 405 nm,
wherein the seed layer has therealong a ten-point mean roughness Rz lower than 1 μm,
wherein the seed-layer forming step comprises:
applying a primer which is uncured and made of polymer resin onto the substrate material to lower surface roughness of the substrate material, thereby the primer being in close contact with the substrate material;
curing the primer which fills uneven surface of the substrate material by pressure and heat applied by a hot-press device; and
forming the seed layer on the primer.

2. The method according to claim 1, wherein
the seed layer and the conductive material are different in material from each other, and
the seed-layer patterning step comprises patterning the seed layer by a selective etching solution capable of dissolving only the seed layer.

3. The method according to claim 2, wherein the seed layer comprises silver (Ag), and the conductive material comprises copper (Cu).

4. The method according to claim 3, wherein the selective etching solution comprises an oxidizing agent; amines or an ammonium compound; an additive; and water.

5. The method according to claim 4, wherein the oxidizing agent comprises one or more selected from a group consisting of oxidative gas, peroxides, peroxy acid, and potassium persulfate.

6. The method according to claim 5, wherein
the oxidative gas comprises one or more selected from a group consisting of air, oxygen, and ozone;
the peroxide comprises one or more selected from a group consisting of sodium perborate, hydrogen peroxide, sodium bismuthate, sodium percarbonate, benzoyl peroxide, potassium peroxide, and sodium peroxide; and
the peroxy acid comprises one or more selected from a group consisting of formic acid, peroxyacetic acid, perbenzoic acid, 3-chloroperoxybenzoic acid, and trimethylacetic acid.

7. The method according to claim 4, wherein the amines comprise one or more selected from a group consisting of an aliphatic amine, an aromatic amine, and an alkanol amine.

8. The method according to claim 4, wherein the amines or ammonium compound comprises one or more selected from a group consisting of ethylamine, propylamine, isopropylamine, n-butylamine, isobutylamine, sec-butylamine, diethylamine, piperidine, tyramine, N-methyltyramine, pyrroline, pyrrolidine, imidazole, indole, pyrimidine, monoethanolamine, 6-amino-2-methyl-2-heptanol, 1-amino-2-propanol, methanolamine, dimethylethanolamine, N-methyldiethnaolamine, 1-aminoethanol, 2-amino-2-methyl-1-propanol, ammonium carbonate, ammonium phosphate, ammonium nitrate, ammonium fluoride, and ammonium hydroxide.

9. The method according to claim 4, wherein the additive comprises one or more selected from a group consisting of a chelate agent, an antifoaming agent, a wetting agent, and a pH regulator.

10. The method according to claim 3, wherein the selective etching solution comprises 1 to 30 wt % of oxidizing agent, 1 to 75 wt % of amine or ammonium compound, 0.1 to 10 wt % of additive, and a remaining wt % of water with respect to a total 100 wt % of the selective etching solution.

* * * * *